(12) United States Patent
Yang et al.

(10) Patent No.: US 10,748,724 B2
(45) Date of Patent: Aug. 18, 2020

(54) POWER-ON/OFF DRIVE CIRCUIT AND METHOD FOR CONTROLLING POWER-ON/OFF DRIVE CIRCUIT

(71) Applicant: HUAWEI TECHNOLOGIES CO., LTD., Shenzhen (CN)

(72) Inventors: Jing Yang, Shenzhen (CN); Peng Zhang, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 200 days.

(21) Appl. No.: 16/010,509

(22) Filed: Jun. 17, 2018

(65) Prior Publication Data

US 2018/0301306 A1 Oct. 18, 2018

Related U.S. Application Data

(63) Continuation of application No. PCT/CN2016/106912, filed on Nov. 23, 2016.

(30) Foreign Application Priority Data

Dec. 17, 2015 (CN) .......................... 2015 1 0953722

(51) Int. Cl.
  *H01H 47/32* (2006.01)
  *H02M 1/36* (2007.01)
  (Continued)

(52) U.S. Cl.
  CPC ............ *H01H 47/32* (2013.01); *H01H 9/542* (2013.01); *H02M 1/32* (2013.01); *H02M 1/36* (2013.01); *H03K 17/08122* (2013.01)

(58) Field of Classification Search
  CPC ......... H03K 17/0812; H03K 17/08122; H01H 47/32; G06F 1/26; H02J 9/061;
  (Continued)

(56) References Cited

U.S. PATENT DOCUMENTS 8,760,004 B2 * 6/2014 Weale ................. H02J 13/0079
  307/11
2002/0060895 A1 5/2002 Tamai et al.
  (Continued)

FOREIGN PATENT DOCUMENTS

CN 2781426 Y 5/2006
CN 101316040 A 12/2008
  (Continued)

*Primary Examiner* — Rexford N Barnie
*Assistant Examiner* — Jagdeep S Dhillon
(74) *Attorney, Agent, or Firm* — Kilpatrick Townsend & Stockton LLP

(57) ABSTRACT

The present invention discloses a power-on/off drive circuit and a method for controlling the power-on/off drive circuit, and belongs to the field of electronic technologies. The power-on/off drive circuit includes a load, a switch circuit, a relay, and a single-source drive circuit; one end of a coil in the relay and a first input end of the single-source drive circuit are separately connected to a positive electrode of a second external power supply, and the other end of the coil in the relay is connected to a second input end of the single-source drive circuit; and a first output end of the single-source drive circuit is connected to a second input end of the switch circuit, a second output end of the single-source drive circuit is connected to the output end of the switch circuit, and a third output end of the single-source drive circuit is connected to a negative electrode of the second external power supply. In the present invention, a volume of a power-on/off drive circuit is reduced.

10 Claims, 10 Drawing Sheets

(51) Int. Cl.
*H02M 1/32* (2007.01)
*H01H 9/54* (2006.01)
*H03K 17/0812* (2006.01)

(58) Field of Classification Search
CPC ...... H02J 9/06; H02J 3/38; H02J 3/382; H02J 3/383; H02J 3/386; H01J 1/00
USPC ............. 307/85, 80, 82, 66, 64, 9.1, 87
See application file for complete search history.

(56) References Cited

U.S. PATENT DOCUMENTS

| | | | | |
|---|---|---|---|---|
| 2006/0202556 | A1* | 9/2006 | Tanaka | H01H 9/548 307/11 |
| 2008/0174926 | A1* | 7/2008 | Evans | H02H 9/001 361/90 |
| 2010/0127569 | A1* | 5/2010 | Dai | H02J 9/061 307/64 |
| 2010/0280677 | A1* | 11/2010 | Budike, Jr. | H05B 47/19 700/296 |
| 2014/0265595 | A1* | 9/2014 | Cheng | H02J 9/062 307/66 |
| 2014/0312691 | A1* | 10/2014 | Doljack | H02J 7/0042 307/29 |
| 2015/0349586 | A1* | 12/2015 | Rodriguez | H05B 45/00 307/23 |
| 2016/0118782 | A1 | 4/2016 | Zhang et al. | |
| 2016/0164295 | A1* | 6/2016 | Cheng | H02J 3/38 307/22 |
| 2016/0172900 | A1* | 6/2016 | Welch, Jr. | H02J 9/062 307/64 |
| 2017/0040838 | A1* | 2/2017 | Huang | H02J 9/066 |

FOREIGN PATENT DOCUMENTS

| | | | | |
|---|---|---|---|---|
| CN | 101710548 | A | 5/2010 | |
| CN | 203289394 | U | 11/2013 | |
| CN | 203299595 | U | 11/2013 | |
| CN | 103647441 | A | 3/2014 | |
| CN | 103707772 | A | 4/2014 | |
| CN | 105553246 | A | 5/2016 | |
| GB | 2193844 | A * | 2/1988 | ....... H03K 17/08144 |
| GB | 2193844 | A | 2/1988 | |
| JP | 2013074741 | A | 4/2013 | |

\* cited by examiner

POWER-ON/OFF DRIVE CIRCUIT AND METHOD FOR CONTROLLING POWER-ON/OFF DRIVE CIRCUIT

CROSS-REFERENCE TO RELATED APPLICATIONS

This application is a continuation of International Application No. PCT/CN2016/106912, filed on Nov. 23, 2016, which claims priority to Chinese Patent Application No. 201510953722.3, filed on Dec. 17, 2015. The disclosures of the aforementioned applications are hereby incorporated by reference in their entireties.

TECHNICAL FIELD

Embodiments of the present invention relate to the field of electronic technologies, and in particular, to a power-on/off drive circuit and a method for controlling the power-on/off drive circuit.

BACKGROUND

In a communications system, to improve electric energy utilization, power management needs to be performed on a communication power supply in the communications system, to effectively distribute electric energy of the communication power supply to different loads in the communications system. When power management is performed, different loads may be powered on/off to allocate electric energy to the different loads. The different loads may be powered on/off by using a power-on/off drive circuit. That the different loads are powered on/off means that the different loads are powered on or powered off, that the loads are powered on means that power is supplied to the loads, and that the loads are powered off means that power supply to the loads is disabled.

Currently, a power-on/off drive circuit is provided. As shown in FIG. 1, the power-on/off drive circuit includes a load 1, a contactor 2, a relay 3, a relay drive circuit 4, a metal oxide semiconductor (Metal Oxide Semiconductor, MOS for short) transistor 5, and a MOS transistor drive circuit 6. One end of the load 1 is connected to a positive electrode of an external power supply, the other end of the load 1 is connected to a normally closed contact 2a of the contactor 2, and a normally open contact 2b of the contactor 2 is connected to a negative electrode of the external power supply. One end of a coil in the contactor 2 is connected to the positive electrode of the external power supply, and the other end of the coil in the contactor 2 is connected to a normally closed contact 3a of the relay 3. The relay 3 is connected in series to the MOS transistor 5, and a normally open contact 3b of the relay 3 is connected to a drain d of the MOS transistor 5. The relay drive circuit 4 is connected in parallel between two ends of a coil in the relay 3, the MOS transistor drive circuit 6 is connected in parallel between a gate g and a source s of the MOS transistor 5, and the source s of the MOS transistor 5 is connected to the negative electrode of the external power supply. In addition, when power-on/off driving is performed by using the power-on/off drive circuit, the relay drive circuit 4 controls closing or opening of the relay 3, and the MOS transistor drive circuit 6 controls turning on or off of the MOS transistor 5, so as to control closing or opening of the contactor 2, to power on or power off the load 1.

In a process of implementing the present invention, the inventor finds that the prior art has at least the following problem: Because the contactor 2 has a relatively large volume, and the relay 3 and the MOS transistor 5 need to be controlled by different drive circuits, an entire volume of the power-on/off drive circuit is relatively large.

SUMMARY

To resolve a prior-art problem of a relatively large volume of a power-on/off drive circuit, embodiments of the present invention provide a power-on/off drive circuit and a method for controlling the power-on/off drive circuit. The technical solutions are as follows:

A first aspect provides a power-on/off drive circuit, where the power-on/off drive circuit includes a load, a switch circuit, a relay, and a single-source drive circuit, and the single-source drive circuit is a drive circuit that controls the switch circuit and the relay;

one end of the load is connected to a positive electrode of a first external power supply, a first input end of the switch circuit and a normally open contact of the relay are separately connected to the other end of the load, and an output end of the switch circuit and a normally closed contact of the relay are separately connected to a negative electrode of the first external power supply;

one end of a coil in the relay is connected to a positive electrode of a second external power supply, a first input end of the single-source drive circuit is connected to the positive electrode of the second external power supply, and the other end of the coil in the relay is connected to a second input end of the single-source drive circuit;

a first output end of the single-source drive circuit is connected to a second input end of the switch circuit, a second output end of the single-source drive circuit is connected to the output end of the switch circuit, and a third output end of the single-source drive circuit is connected to a negative electrode of the second external power supply; and the first external power supply and the second external power supply have a same negative electrode; when the second external power supply is switched on, the single-source drive circuit is configured to perform control to turn on the switch circuit and perform control to close the relay, so as to power on the load; when the second external power supply is switched off, the single-source drive circuit is configured to perform control to open the relay and perform control to turn off the switch circuit, so as to power off the load; and the second external power supply is configured to provide electric energy for the single-source drive circuit and the relay.

It should be noted that, in the embodiments of the present invention, a switch circuit and a relay are controlled by a same drive circuit. Therefore, the drive circuit may be referred to as a single-source drive circuit.

In the embodiments of the present invention, when a load is powered on by using the power-on/off drive circuit, a second external power supply is switched on, so that a single-source drive circuit performs control to turn on a switch circuit and performs control to close a relay, so as to power on the load. When the load is powered off by using the power-on/off drive circuit, the second external power supply is switched off, so that the single-source drive circuit performs control to open the relay and performs control to turn off the switch circuit, so as to power off the load. In the embodiments of the present invention, a load can be powered on/off by using only the switch circuit and the relay and without using a contactor. The switch circuit and the relay are controlled by a same single-source drive circuit, and do not need to be manually controlled. Therefore, an entire volume of the power-on/off drive circuit is reduced, and the power-on/off drive circuit is made more intelligent.

With reference to the first aspect, in a first possible implementation of the first aspect, the single-source drive circuit includes a first driver module and a second driver module;

an input end of the first driver module is connected to the positive electrode of the second external power supply, a first output end of the first driver module is connected to the second input end of the switch circuit, and a second output end of the first driver module is connected to the output end of the switch circuit;

a third output end of the first driver module is connected to a first input end of the second driver module, a second input end of the second driver module is connected to the other end of the coil in the relay, and an output end of the second driver module is connected to the negative electrode of the second external power supply; and there is a voltage stabilization feature at the third output end of the first driver module.

In the embodiments of the present invention, based on a voltage stabilization feature at a third output end of a first driver module, when a load is powered on, control may be first performed to turn on a switch circuit, and then control may be performed to close a relay; when the load is powered off, control may be first performed to open the relay, and then control may be performed to turn off the switch circuit. Therefore, an electric arc can be prevented from being generated at a moment when the relay is closed or opened, arc extinguishing may be implemented when the relay is closed or opened, and the relay can be prevented from being damaged. In addition, in the embodiments of the present invention, the switch circuit and the relay can be controlled in sequence during power-on/off driving by using only pure hardware and without using an extra controller. In this way, a circuit structure is simplified, and circuit costs are reduced.

With reference to the first possible implementation of the first aspect, in a second possible implementation of the first aspect, the first driver module includes a first diode, a first resistor, a second resistor, a third resistor, a first voltage stabilization tube, a first transistor, a second transistor, and a third transistor;

an anode of the first diode is connected to the positive electrode of the second external power supply, a cathode of the first diode is connected to one end of the first resistor, and a positive electrode of the first voltage stabilization tube, one end of the second resistor, a collector of the second transistor, a collector of the third transistor, and the second input end of the switch circuit are separately connected to the other end of the first resistor;

a negative electrode of the first voltage stabilization tube is connected to one end of the third resistor, the other end of the third resistor is connected to a base of the first transistor, a collector of the first transistor and the other end of the second resistor are separately connected to a base of the second transistor, and an emitter of the second transistor is connected to a base of the third transistor; and an emitter of the first transistor and an emitter of the third transistor are separately connected to the output end of the switch circuit.

In the embodiments of the present invention, unidirectional conductivity of a first diode can effectively prevent a component in a single-source drive circuit from being damaged during reversed connection of a second external power supply. In addition, based on a voltage stabilization feature of a second voltage stabilization tube, when a load is powered on, control may be first performed to turn on a switch circuit, and then control may be performed to close a relay; when the load is powered off, control may be first performed to open the relay, and then control may be performed to turn off the switch circuit. Therefore, an electric arc is prevented from being generated at a moment when the relay is closed or opened, arc extinguishing is implemented when the relay is closed or opened, and the relay is prevented from being damaged. In addition, in the embodiments of the present invention, the switch circuit and the relay can be controlled in sequence during power-on/off driving by using only pure hardware and without using an extra controller. In this way, a circuit structure is simplified, and circuit costs are reduced.

With reference to the second possible implementation of the first aspect, in a third possible implementation of the first aspect, the first driver module further includes a first capacitor; and the first capacitor is connected in parallel between the collector and the emitter of the first transistor.

In the embodiments of the present invention, when a second external power supply is switched on, charges may accumulate on two plates of a first capacitor, so as to delay a time for turning on a first voltage stabilization tube. In this way, it is further ensured that, when a load is powered on, a second driver module can drive a relay to a closed state only after a switch circuit is turned on. When the second external power supply is switched off, the first capacitor may discharge electricity within a short time by using the previously accumulated charges, to provide a current for a first driver module, so that within a short time, the first driver module can continue to drive the switch circuit to an on state. In this way, it is further ensured that, when the load is powered off, the first driver module can drive the switch circuit to an off state only after the relay is opened. Therefore, an electric arc is prevented from being generated at a moment when the relay is closed or opened, arc extinguishing is implemented when the relay is closed or opened, and the relay is prevented from being damaged.

With reference to any one of the first possible implementation of the first aspect to the third possible implementation of the first aspect, in a fourth possible implementation of the first aspect, the second driver module includes a fourth resistor, a fourth transistor, a fifth transistor, and a second diode;

one end of the fourth resistor is connected to the negative electrode of the first voltage stabilization tube, the other end of the fourth resistor is connected to a base of the fourth transistor, an emitter of the fourth transistor is connected to a base of the fifth transistor, an emitter of the fifth transistor is connected to an anode of the second diode, and a cathode of the second diode is connected to the negative electrode of the second external power supply; and a collector of the fourth transistor and a collector of the fifth transistor are separately connected to the other end of the coil in the relay.

In the embodiments of the present invention, unidirectional conductivity of a second diode can effectively prevent a component in a single-source drive circuit from being damaged during reversed connection of a second external power supply.

With reference to any one of the first aspect to the fourth possible implementations of the first aspect, in a fifth possible implementation of the first aspect, the switch circuit includes a first metal oxide semiconductor MOS transistor; and a drain of the first MOS transistor is connected to the other end of the load, a gate of the first MOS transistor is connected to the first output end of the single-source drive circuit, and the second output end of the single-source drive circuit and the negative electrode of the first external power supply are separately connected to a source of the first MOS transistor.

In the embodiments of the present invention, a relay is closed after a first MOS transistor is turned on. Because the relay and the first MOS transistor are connected in parallel, some currents of a first external power supply may flow into a negative electrode of the first external power supply through the first MOS transistor, and other currents of the first external power supply may flow into the negative electrode of the first external power supply through the relay. In this way, fewer currents flow through the first MOS transistor, and less heat is generated inside the first MOS transistor when the first MOS transistor is turned on, so that the first MOS transistor is prevented from being burned.

With reference to the fifth possible implementation of the first aspect, in a sixth possible implementation of the first aspect, the switch circuit further includes a second MOS transistor; and a gate of the second MOS transistor is connected to the gate of the first MOS transistor, a source of the second MOS transistor and the second output end of the single-source drive circuit are separately connected to the source of the first MOS transistor, and a drain of the second MOS transistor is connected to the negative electrode of the first external power supply.

In the embodiments of the present invention, a second MOS transistor is connected in series to a first MOS transistor in a reverse manner. In this case, a body diode in the second MOS transistor is also connected in series to a body diode in the first MOS transistor in a reverse manner. Therefore, the body diodes in the first MOS transistor and the second MOS transistor are in a reverse cut-off state during reversed connection of a first external power supply, and turning on and off of a switch circuit are still controlled by a single-source drive circuit. This effectively avoids a failure in controlling the switch circuit by the single-source drive circuit during reversed connection of the first external power supply. In addition, withstand voltage values of the first MOS transistor and the second MOS transistor are relatively large. Therefore, when a circuit voltage rises due to reversed connection of the first external power supply, the first MOS transistor and the second MOS transistor may share a relatively large part of the voltage, so that a load shares a relatively small part of the voltage. In this way, the load is prevented from being damaged during reversed connection of the first external power supply. Moreover, because the first MOS transistor and the second MOS transistor are connected in series in a reverse manner, a current in the switch circuit may flow into the second MOS transistor through the first MOS transistor, and may also flow into the first MOS transistor through the second MOS transistor. Therefore, bidirectional power-on/off driving can be implemented.

With reference to the fifth possible implementation of the first aspect or the sixth possible implementation of the first aspect, in a seventh possible implementation of the first aspect, the power-on/off drive circuit further includes a protective circuit; and the protective circuit is connected in parallel between the gate and the source of the first MOS transistor.

In the embodiments of the present invention, a protective circuit can prevent a relatively high voltage from being generated between a gate and a source of a first MOS transistor, so as to prevent the relatively high voltage from damaging the first MOS transistor, and protect a switch circuit. Optionally, when the switch circuit further includes a second MOS transistor, the protective circuit is also connected in parallel between a gate and a source of the second MOS transistor, so as to prevent the second MOS transistor from being damaged.

With reference to the seventh possible implementation of the first aspect, in an eighth possible implementation of the first aspect, the protective circuit includes a fifth resistor, a second capacitor, and a second voltage stabilization tube; and the fifth resistor, the second capacitor, and the second voltage stabilization tube are connected in parallel.

In the embodiments of the present invention, a fifth resistor may release a charge of a gate of a first MOS transistor to avoid charge accumulation, so as to prevent the first MOS transistor from being damaged by a relatively high voltage generated between a gate and a source of the first MOS transistor. In addition, a second capacitor absorbs the charge of the gate to avoid charge accumulation, so as to further prevent the first MOS transistor from being damaged. Moreover, when a relatively high voltage is generated between the gate and the source of the first MOS transistor, within a short time, a second voltage stabilization tube may limit the voltage between the gate and the source to a value below a stabilized voltage value of the second voltage stabilization tube. In this way, the first MOS transistor is further prevented from being damaged. Optionally, when a switch circuit further includes a second MOS transistor, the fifth resistor, the second capacitor, and the second voltage stabilization tube may also protect the second MOS transistor.

A second aspect provides a method for controlling the power-on/off drive circuit according to any one of the first aspect to the eighth possible implementations of the first aspect, and the method includes:

performing, by the single-source drive circuit when the second external power supply is switched on, control to turn on the switch circuit and close the relay, so as to power on the load; or performing, by the single-source drive circuit when the second external power supply is switched off, control to open the relay and turn off the switch circuit, so as to power off the load.

It should be noted that, in the embodiments of the present invention, a switch circuit and a relay are controlled by a same drive circuit. Therefore, the drive circuit may be referred to as a single-source drive circuit.

In the embodiments of the present invention, a load can be powered on/off by using only the switch circuit and the relay and without using a contactor. The switch circuit and the relay are controlled by a same single-source drive circuit, and do not need to be manually controlled. Therefore, an entire volume of the power-on/off drive circuit is reduced, and the power-on/off drive circuit is made more intelligent.

With reference to the second aspect, in a first possible implementation of the second aspect, the single-source drive circuit includes a first driver module and a second driver module, and there is a voltage stabilization feature at a third output end of the first driver module; and the performing, by the single-source drive circuit when the second external power supply is switched on, control to turn on the switch circuit and close the relay includes:

when the second external power supply is switched on, enabling a current of the second external power supply to flow into the first driver module, and driving, by a first output end of the first driver module, the switch circuit to an on state; and based on the voltage stabilization feature at the third output end of the first driver module, after the switch circuit is turned on, enabling the current of the second external power supply to flow into the second driver module through the third output end of the first driver module, and driving, by the second driver module, the relay to a closed state.

In the embodiments of the present invention, based on a voltage stabilization feature at a third output end of a first driver module, when a load is powered on, control may be first performed to turn on a switch circuit, and then control may be performed to close a relay. Therefore, an electric arc can be prevented from being generated at a moment when the relay is closed, arc extinguishing may be implemented when the relay is closed, and the relay can be prevented from being damaged. In addition, in the embodiments of the present invention, by using only pure hardware and without using an extra controller, the switch circuit and the relay can be controlled in sequence when the load is powered on. In this way, a circuit structure is simplified, and circuit costs are reduced.

With reference to the second aspect, in a second possible implementation of the second aspect, the single-source drive circuit includes a first driver module and a second driver module, and there is a voltage stabilization feature at a third output end of the first driver module; and the performing, by the single-source drive circuit when the second external power supply is switched off, control to open the relay and turn off the switch circuit includes:

when the second external power supply is switched off, disconnecting a current that flows into the second driver module, to open the relay; and based on the voltage stabilization feature at the third output end of the first driver module, after the relay is opened, disconnecting a current that flows into the first driver module, to turn off the switch circuit.

In the embodiments of the present invention, based on a voltage stabilization feature at a third output end of a first driver module, when a load is powered off, control may be first performed to open a relay, and then control may be performed to turn off a switch circuit. Therefore, an electric arc can be prevented from being generated at a moment when the relay is opened, arc extinguishing may be implemented when the relay is opened, and the relay can be prevented from being damaged. In addition, in the embodiments of the present invention, by using only pure hardware and without using an extra controller, the switch circuit and the relay can be controlled in sequence when the load is powered off. In this way, a circuit structure is simplified, and circuit costs are reduced.

In the embodiments of the present invention, when a load is powered on, a single-source drive circuit performs control to turn on a switch circuit and performs control to close a relay; when the load is powered off, the single-source drive circuit performs control to open the relay and performs control to turn off the switch circuit. In the power-on/off drive circuit, the load can be powered on/off by using only the switch circuit and the relay and without using a contactor, and the switch circuit and the relay are controlled by a same single-source drive circuit. Therefore, an entire volume of the power-on/off drive circuit is reduced.

It should be noted that the foregoing general description and the following detailed description are only examples for explanation, and cannot limit the present invention.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

REFERENCE NUMERALS

In the prior art:

1: a load; 2: a contactor; 2a: a normally closed contact of the contactor; 2b: a normally open contact of the contactor; 3: a relay; 3a: a normally closed contact of the relay; 3b: a normally open contact of the relay; 4: a relay drive circuit; 5: a MOS transistor; s: a source of the MOS transistor; g: a gate of the MOS transistor; d: a drain of the MOS transistor; and 6: a MOS transistor drive circuit.

In the embodiments of the present invention:

7: a load; 8: a switch circuit; 8a: a first input end of the switch circuit; 8b: a second input end of the switch circuit; 8c: an output end of the switch circuit; s1: a source of a first MOS transistor; g1: a gate of the first MOS transistor; d1: a drain of the first MOS transistor; s2: a source of a second MOS transistor; g2: a gate of the second MOS transistor; d2: a drain of the second MOS transistor; 9: a relay; 9a: a normally open contact of the relay; 9b: a normally closed contact of the relay; and D5: a third diode;

10: a single-source drive circuit; 10a: a first input end of the single-source drive circuit; 10b: a second input end of the single-source drive circuit; 10c: a first output end of the single-source drive circuit; 10d: a second output end of the single-source drive circuit; and 10e: a third output end of the single-source drive circuit;

10A: a first driver module; D1: a first diode; R1: a first resistor; R2: a second resistor; R3: a third resistor; D2: a first voltage stabilization tube; Q1: a first transistor; Q2: a second transistor; Q3: a third transistor; C1: a first capacitor; 10B: a second driver module; R4: a fourth resistor; Q4: a fourth transistor; Q5: a fifth transistor; and D3: a second diode; and 11: a protective circuit; R5: a fifth resistor; C2: a second capacitor; D4: a second voltage stabilization tube; 12: a lightning protection circuit; R6: a sixth resistor; 13: a first main control unit (Main Control Unit, MCU for short); R7: a seventh resistor; and 14: a second MCU.

DESCRIPTION OF EMBODIMENTS

To make the objectives, technical solutions, and advantages of the present invention clearer, the following further describes the embodiments of the present invention in detail with reference to the accompanying drawings.

Figure 1:
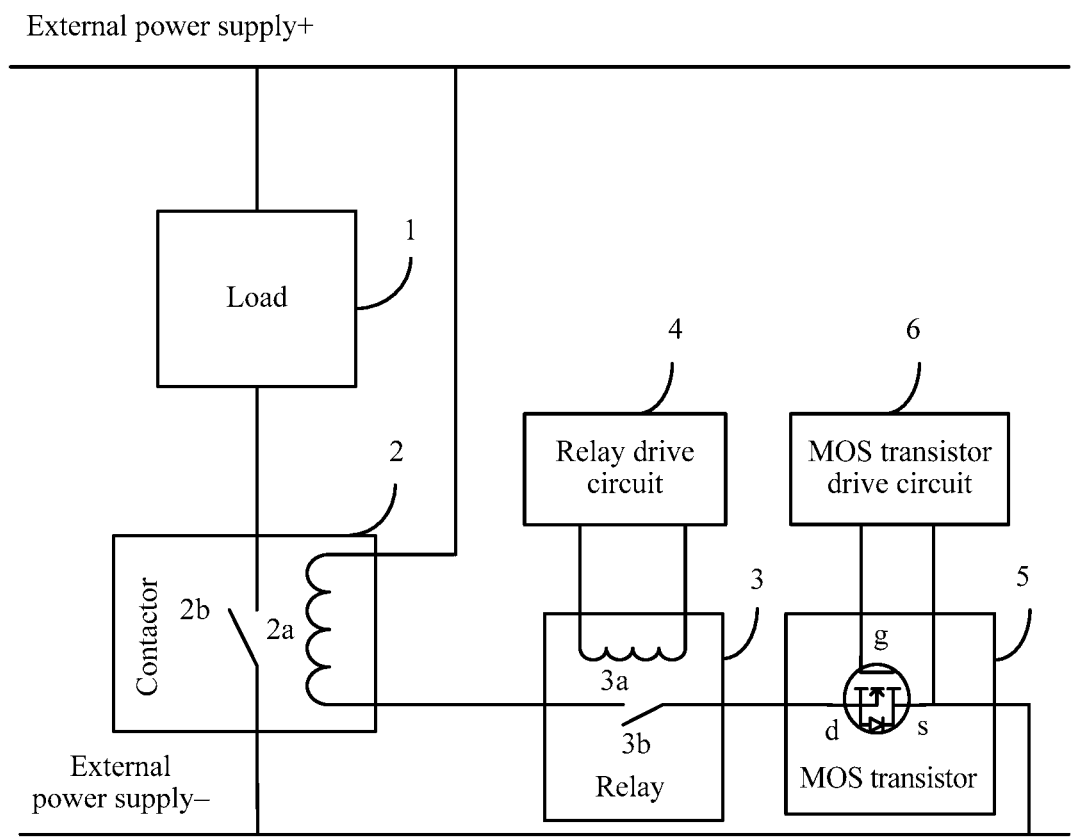
FIG. 1 is a schematic structural diagram of a power-on/off drive circuit in the prior art.
Figure 2:
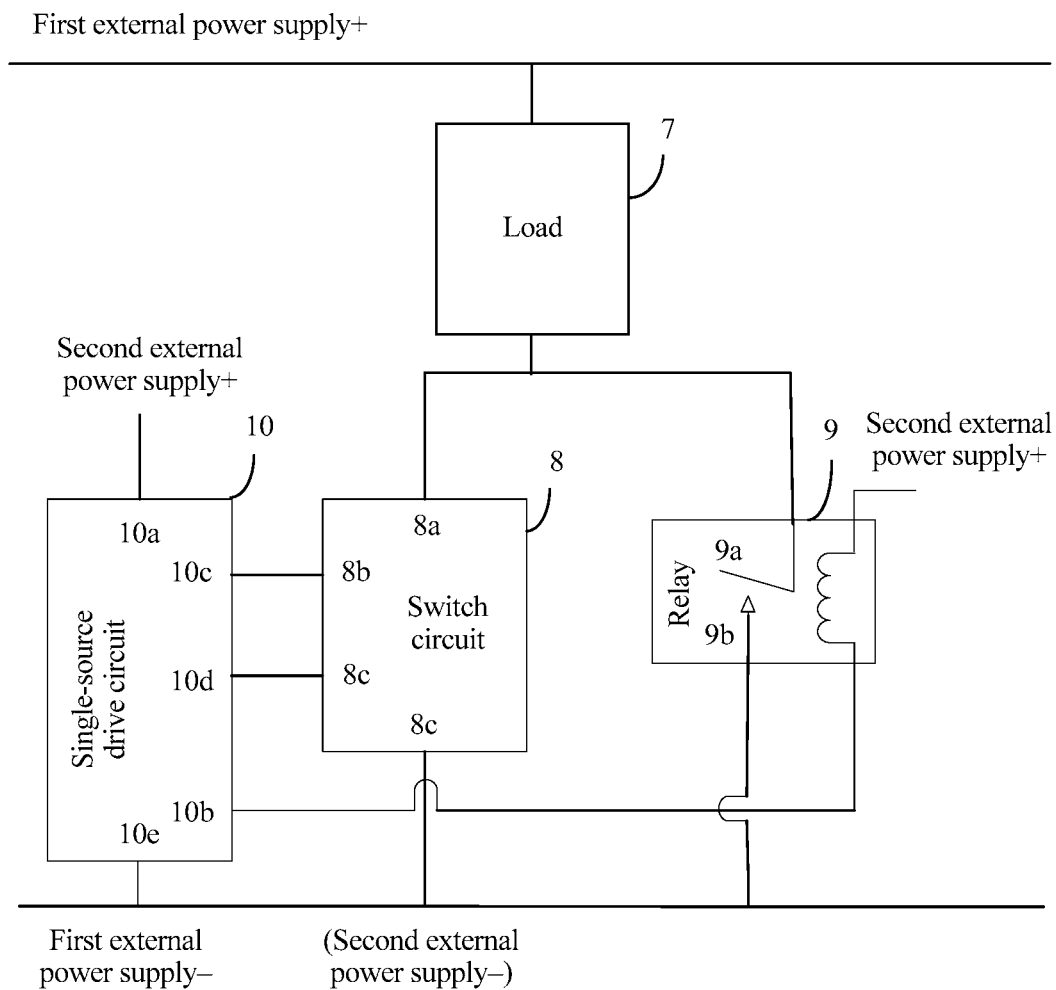
FIG. 2 is a schematic structural diagram of a first power-on/off drive circuit according to an embodiment of the present invention.

FIG. 2 is a schematic structural diagram of a power-on/off drive circuit according to an embodiment of the present invention. Referring to FIG. 2, the power-on/off drive circuit includes a load 7, a switch circuit 8, a relay 9, and a single-source drive circuit 10, and the single-source drive circuit 10 is a drive circuit that controls the switch circuit 8 and the relay 9.

One end of the load 7 is connected to a positive electrode of a first external power supply, a first input end 8a of the switch circuit 8 and a normally open contact 9a of the relay 9 are separately connected to the other end of the load 7, and an output end 8c of the switch circuit 8 and a normally closed contact 9b of the relay 9 are separately connected to a negative electrode of the first external power supply. One end of a coil in the relay 9 is connected to a positive electrode of a second external power supply, a first input end 10a of the single-source drive circuit 10 is connected to the positive electrode of the second external power supply, and the other end of the coil in the relay 9 is connected to a second input end 10b of the single-source drive circuit 10. A first output end 10c of the single-source drive circuit 10 is connected to a second input end 8b of the switch circuit 8, a second output end 10d of the single-source drive circuit 10 is connected to the output end 8c of the switch circuit 8, and a third output end 10e of the single-source drive circuit 10 is connected to a negative electrode of the second external power supply. The first external power supply and the second external power supply have a same negative electrode. When the second external power supply is switched on, the single-source drive circuit 10 is configured to perform control to turn on the switch circuit 8 and close the relay 9, so as to power on the load 7; when the second external power supply is switched off, the single-source drive circuit 10 is configured to perform control to open the relay 9 and perform control to turn off the switch circuit 8, so as to power off the load 7. The second external power supply is configured to provide electric energy for the single-source drive circuit 10 and the relay 9.

It should be noted that, in this embodiment of the present invention, the switch circuit 8 and the relay 9 are controlled by a same drive circuit. Therefore, the drive circuit may be referred to as the single-source drive circuit, that is, the drive circuit that can control both the switch circuit 8 and the relay 9 is the single-source drive circuit 10.

When the load 7 is powered on by using the power-on/off drive circuit, the second external power supply is switched on, so that the single-source drive circuit 10 performs control to turn on the switch circuit 8 and performs control to close the relay 9. In this case, after passing through the load 7 from the positive electrode of the first external power supply, a current of the first external power supply flows into the negative electrode of the first external power supply through the switch circuit 8 and the relay 9. Therefore, the load 7 may be powered on. When the load 7 is powered off by using the power-on/off drive circuit, the second external power supply is switched off, so that the single-source drive circuit 10 performs control to open the relay 9 and performs control to turn off the switch circuit 8. In this case, the current of the first external power supply cannot flow into the negative electrode of the first external power supply from the positive electrode of the first external power supply through the load 7. Therefore, the load 7 may be powered off.

When the second external power supply is switched on or switched off, a user may manually connect or disconnect the second external power supply, or certainly, the second external power supply may be intelligently connected or disconnected by using a control policy. This is not specifically limited in this embodiment of the present invention.

It should be noted that, in the power-on/off drive circuit, the load 7 can be powered on/off by using only the switch circuit 8 and the relay 9 and without using a contactor. The switch circuit 8 and the relay 9 are controlled by the same single-source drive circuit 10, and do not need to be manually controlled. Therefore, an entire volume of the power-on/off drive circuit is reduced, and the power-on/off drive circuit is made more intelligent.

It should be further noted that the load 7 may include devices such as a storage battery and a communications device. This is not specifically limited in this embodiment of the present invention.

In addition, the first external power supply and the second external power supply are configured to provide electric energy for the power-on/off drive circuit. The first external power supply is configured to provide electric energy for the load 7, the second external power supply is configured to provide electric energy for the single-source drive circuit 10 and the relay 9, and the electric energy provided by the second external power supply is used to turn on the switch circuit 8 and close the relay 9.

Figure 3:
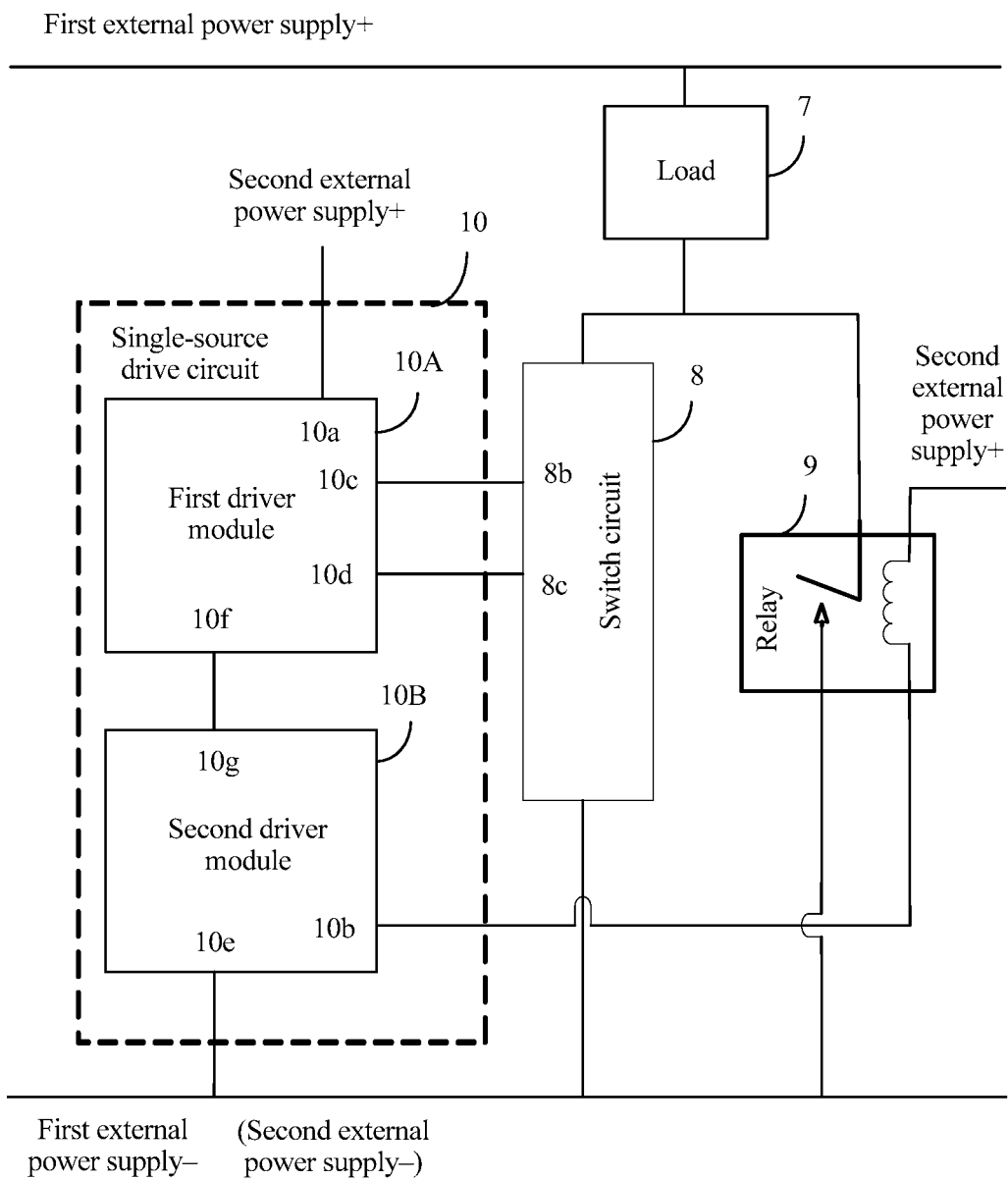
FIG. 3 is a schematic structural diagram of a second power-on/off drive circuit according to an embodiment of the present invention.

Referring to FIG. 3, the single-source drive circuit 10 includes a first driver module 10A and a second driver module 10B.

An input end 10a of the first driver module 10A is connected to the positive electrode of the second external power supply, a first output end 10c of the first driver module 10A is connected to the second input end 8b of the switch circuit 8, and a second output end 10d of the first driver module 10A is connected to the output end 8c of the switch circuit 8. A third output end 10f of the first driver module 10A is connected to a first input end 10g of the second driver module 10B, a second input end 10b of the second driver module 10B is connected to the other end of the coil in the relay 9, and an output end 10e of the second driver module 10B is connected to the negative electrode of the second external power supply. There is a voltage stabilization feature at the third output end 10f of the first driver module 10A.

When the second external power supply is switched on, a current of the second external power supply flows into the first driver module 10A, and the first output end 10c of the first driver module 10A drives the switch circuit 8 to an on state. There is the voltage stabilization feature at the third output end 10f of the first driver module 10A, and the voltage stabilization feature can ensure that a time at which the third output end 10f of the first driver module 10A outputs a voltage is later than a time at which the first output end 10c outputs a voltage. Therefore, a time at which turning on of the switch circuit 8 is driven by using the voltage that is output from the first output end 10c of the first driver module 10A is earlier than a time at which closing of the relay 9 is driven. That is, based on the voltage stabilization feature at the third output end 10f of the first driver module 10A, after the switch circuit 8 is turned on, the current of the second external power supply may flow into the second driver module 10B through the third output end 10f of the first driver module 10A, and the second driver module 10B may drive the relay 9 to a closed state. When the second external power supply is switched off, the current that flows into the second driver module 10B is disconnected, so as to open the relay 9. The voltage stabilization feature at the third output end 10f of the first driver module 10A can ensure that a time at which the voltage is disconnected at the third output end 10f of the first driver module 10A is earlier than a time at which the voltage is disconnected at the first output end 10c. Therefore, a time at which the relay 9 is opened is earlier than a time at which the switch circuit 8 is turned off. That is, based on the voltage stabilization feature at the third output end 10f of the first driver module 10A, after the relay 9 is opened, the current that flows into the first driver module 10A may be disconnected, so as to turn off the switch circuit 8.

Figure 4:
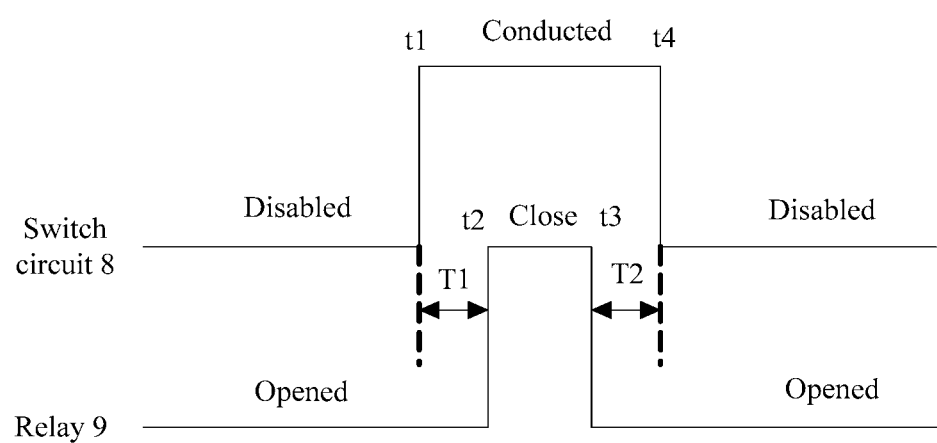
FIG. 4 is a sequence diagram of turning on and off of a switch circuit and closing and opening of a relay according to an embodiment of the present invention.

As shown in FIG. 4, there is the voltage stabilization feature at the third output end 10f of the first driver module 10A. Therefore, at a moment t8 when the second external power supply is switched on, turning on of the switch circuit 8 may be driven by using the voltage that is output from the first output end 10c of the first driver module 10A, and then the first driver module 10A stabilizes a voltage of the first driver module 10A within a time period T8 based on the voltage stabilization feature. The current of the second external power supply needs to flow into the second driver module 10B through the third output end 10f of the first driver module 10A. Therefore, a current flows into the second driver module 10B only at a moment t9 after the first driver module 10A drives the switch circuit 8 to an on state for a time period TI, and then the second driver module 10B can drive the relay 9 to a closed state. At a moment t10 when the second external power supply is switched off, no current flows into the second driver module 10B, and the relay 9 is opened. There is the voltage stabilization feature at the third output end 10f of the first driver module 10A. Therefore, when the second external power supply is switched off, the first driver module 10A may stabilize the voltage of the first driver module 10A within a time period T9 based on the voltage stabilization feature, so as to keep the switch circuit 8 in an on state. At a moment t4 after the time period T9, no current exists in the first driver module 10A, and the switch circuit 8 is turned off.

In this embodiment of the present invention, when the load 7 is powered on, control may be first performed to turn on the switch circuit 8, and then control may be performed to close the relay 9. Because the switch circuit 8 and the relay 9 are connected in parallel, the relay 9 is closed when the switch circuit 8 is in an on state, and in this case, the relay 9 is closed with a zero voltage. Therefore, an electric arc is prevented from being generated at a moment when the relay 9 is closed, arc extinguishing is implemented when the relay 9 is closed, and the relay 9 is prevented from being damaged. When the load 7 is powered off, control may be first performed to open the relay 9, and then control may be performed to turn off the switch circuit 8. Because the switch circuit 8 and the relay 9 are connected in parallel, the relay 9 is opened when the switch circuit 8 is in an on state, and in this case, the relay 9 is opened with a zero voltage. Therefore, an electric arc is prevented from being generated at a moment when the relay 9 is opened, arc extinguishing is implemented when the relay 9 is opened, and the relay 9 is prevented from being damaged. In addition, in this embodiment of the present invention, the switch circuit 8 and the relay 9 can be controlled in sequence during power-on/off driving by using only pure hardware and without using an extra controller. In this way, a circuit structure is simplified, and circuit costs are reduced.

Figure 5:
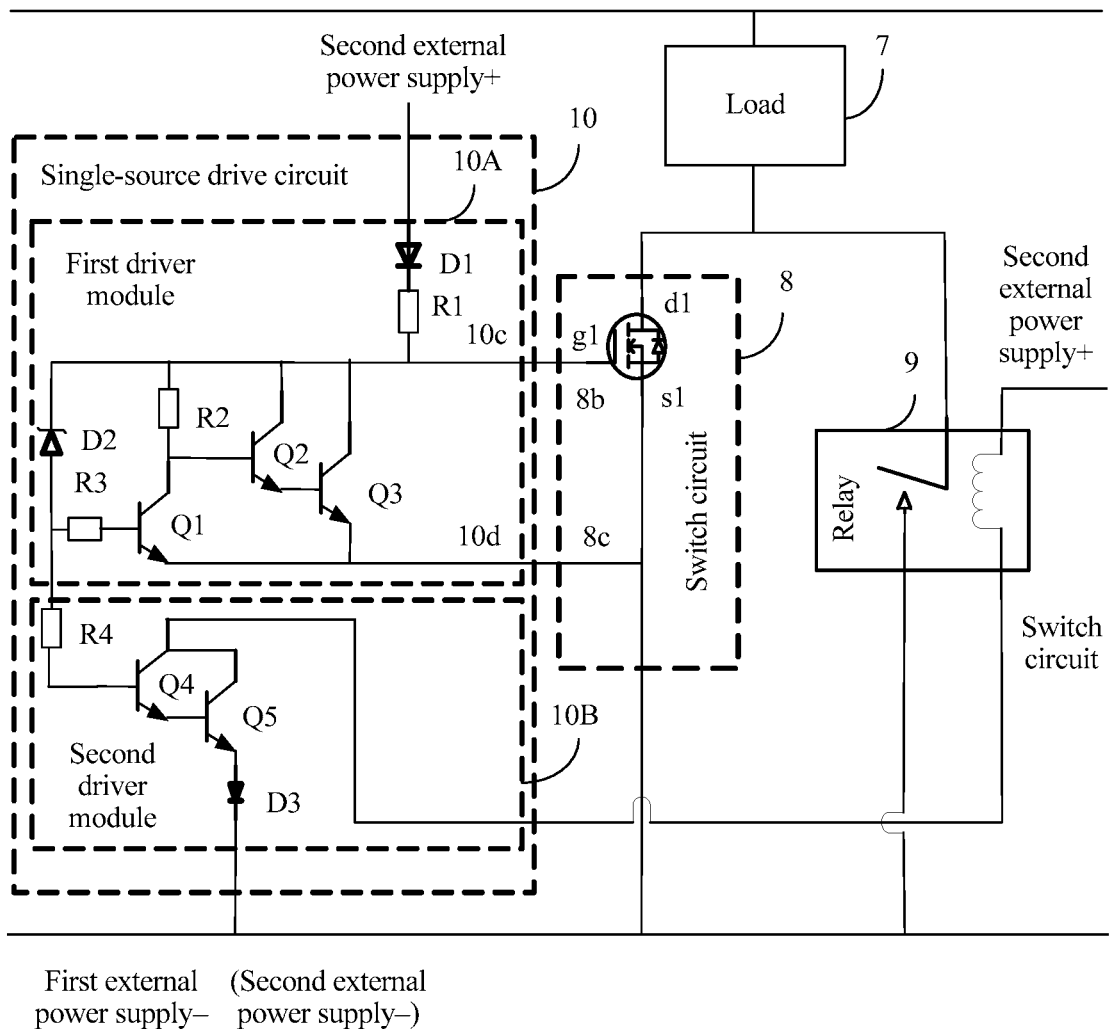
FIG. 5 is a schematic structural diagram of a third power-on/off drive circuit according to an embodiment of the present invention.

Referring to FIG. 5, the first driver module 10A includes a first diode D1, a first resistor R1, a second resistor R2, a third resistor R3, a first voltage stabilization tube D2, a first transistor Q1, a second transistor Q2, and a third transistor Q3.

An anode of the first diode D1 is connected to the positive electrode of the second external power supply, a cathode of the first diode D1 is connected to one end of the first resistor R1, and a positive electrode of the first voltage stabilization tube D2, one end of the second resistor R2, a collector of the second transistor Q2, a collector of the third transistor Q3, and the second input end 1b of the switch circuit 8 are separately connected to the other end of the first resistor R1. A negative electrode of the first voltage stabilization tube D2 is connected to one end of the third resistor R3, the other end of the third resistor R3 is connected to a base of the first transistor Q1, a collector of the first transistor Q1 and the other end of the second resistor R2 are separately connected to a base of the second transistor Q2, and an emitter of the second transistor Q2 is connected to a base of the third transistor Q3. An emitter of the first transistor Q1 and an emitter of the third transistor Q3 are separately connected to the output end 8c of the switch circuit 8.

When the second external power supply is switched on, the current of the second external power supply flows into the switch circuit 8 through the first diode D1 and the first resistor R1, to provide a voltage for the switch circuit 8, so as to turn on the switch circuit 8. After the switch circuit 8 is turned on, voltages at the two ends of the first voltage stabilization tube D2 reach a reverse breakdown voltage within a short time, so that the first voltage stabilization tube D2 is turned on. In this case, the current of the second external power supply may flow into the second driver module 10B through the first driver module 10A, to provide a voltage for the second driver module 10B, so that the second driver module 10B drives the relay 9 to a closed state.

When the second external power supply is switched off, no current flows into the second driver module 10B, and the relay 9 is opened. When the second external power supply is switched off, the first voltage stabilization tube D2 keeps the voltages at the two ends of the first voltage stabilization tube D2 unchanged within a short time, so as to provide a voltage for the first driver module 10A within a short time after the second external power supply is switched off. In this way, within a short time, the first driver module 10A may continue to drive the switch circuit 8 to an on state. After the first voltage stabilization tube D2 cannot maintain the voltages at the two ends of the first voltage stabilization tube D2, no current exists in the first driver module 10A, and the switch circuit 8 is turned off.

It should be noted that the first diode D1 has unidirectional conductivity, that is, a current can flow only from the anode of the first diode D1 into the cathode. Therefore, the first diode D1 is not turned on during reversed connection of the second external power supply, and the current of the second external power supply cannot flow into the single-source drive circuit 10. In this way, a component in the single-source drive circuit 10 can be effectively prevented from being damaged during reversed connection of the second external power supply.

Figure 6:
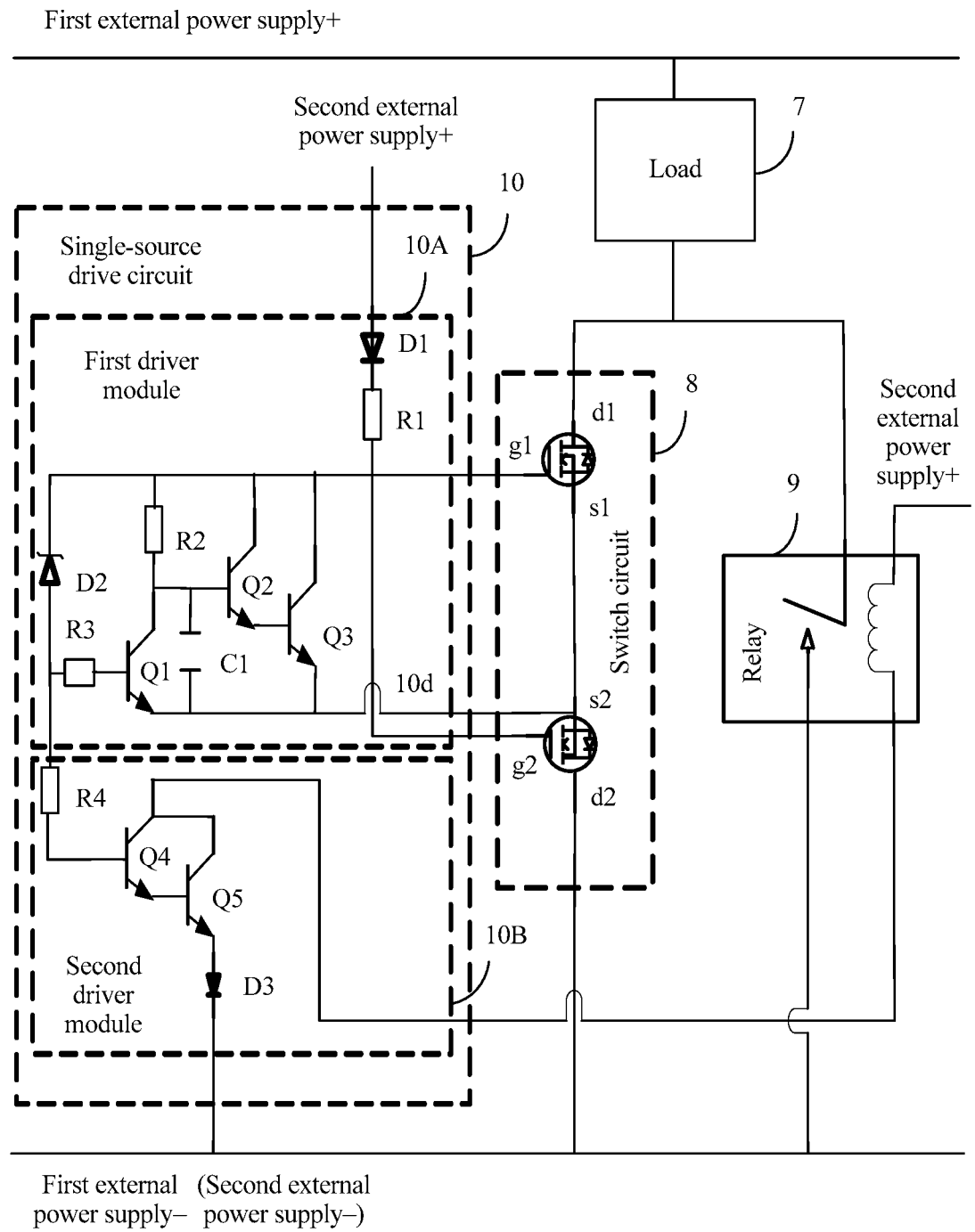
FIG. 6 is a schematic structural diagram of a fourth power-on/off drive circuit according to an embodiment of the present invention.

Further, referring to FIG. 6, the first driver module 10A further includes a first resistor C1, and the first resistor C1 is connected in parallel between the collector and the emitter of the first transistor Q1.

The first capacitor C1 and the second resistor R2 may form an RC charge/discharge circuit. When the second external power supply is switched on, the second external power supply charges the first capacitor C1 by using the second resistor R2. Charges accumulate on two plates of the first capacitor C1, so as to delay a time for the voltages at the two ends of the first voltage stabilization tube D2 to reach the reverse breakdown voltage, and further delay a time for turning on the first voltage stabilization tube D2. In this way, it is further ensured that, when the load 7 is powered on, the second driver module 10B can drive the relay 9 to a closed state only after the switch circuit 8 is turned on. Therefore, an electric arc is prevented from being generated at a moment when the relay 9 is closed, arc extinguishing is implemented when the relay 9 is closed, and the relay 9 is prevented from being damaged.

When the second external power supply is switched off, the first capacitor C1 may discharge electricity within a short time by using the previously accumulated charges, to provide a current for the first driver module 10A, so that within a short time, the first driver module 10A may continue to drive the switch circuit 8 to an on state. In this way, it is further ensured that, when the load 7 is powered off, the first driver module 10A can drive the switch circuit 8 to an off state only after the relay 9 is opened. Therefore, an electric arc is prevented from being generated at a moment when the relay 9 is opened, arc extinguishing is implemented when the relay 9 is opened, and the relay 9 is prevented from being damaged.

Referring to FIG. 5, the second driver module 10B includes a fourth resistor R4, a fourth transistor Q4, a fifth transistor Q5, and a second diode D3.

One end of the fourth resistor R4 is connected to the negative electrode of the first voltage stabilization tube D2, the other end of the fourth resistor R4 is connected to a base of the fourth transistor Q4, an emitter of the fourth transistor Q4 is connected to a base of the fifth transistor Q5, an emitter of the fifth transistor Q5 is connected to an anode of the second diode D3, and a cathode of the second diode D3 is connected to the negative electrode of the second external power supply. A collector of the fourth transistor Q4 and a collector of the fifth transistor Q5 are separately connected to the other end of the coil in the relay 9.

When the second driver module 10B drives the relay 9 to a closed state, the second external power supply is switched on. The current of the second external power supply flows into the second driver module 10B through the first driver module 10A, to provide a voltage for the fourth transistor Q4 and the fifth transistor Q5 in the second driver module 10B, so as to turn on the fourth transistor Q4 and the fifth transistor Q5. The current of the second external power supply also flows into the second driver module 10B through the coil in the relay 9. In this case, the coil in the relay 9 is energized, and the normally open contact 9a of the relay 9 can be picked up. Therefore, the relay 9 is closed. When the second driver module 10B drives the relay 9 to an open state, the second external power supply is switched off. No current flows into the coil in the relay 9. In this case, the coil in the relay 9 is not energized, and the normally open contact 9a of the relay 9 cannot be picked up. Therefore, the relay 9 is opened.

It should be noted that the second diode D3 has unidirectional conductivity, that is, a current can flow only from the anode of the second diode D3 into the cathode. Therefore, the second diode D3 is not turned on during reversed connection of the second external power supply, and the current of the second external power supply cannot flow into the single-source drive circuit 10. In this way, a component in the single-source drive circuit 10 can be effectively prevented from being damaged during reversed connection of the second external power supply.

Referring to FIG. 5, the switch circuit 8 includes a first MOS transistor.

A drain d1 of the first MOS transistor is connected to the other end of the load 7, a gate g1 of the first MOS transistor is connected to the first output end 10c of the single-source drive circuit 10, and the second output end 10d of the single-source drive circuit 10 and the negative electrode of the first external power supply are separately connected to a source s1 of the first MOS transistor.

When a voltage of a gate of a MOS transistor is higher than a breakover voltage of the MOS transistor, a conductive channel is formed between a source and a drain of the MOS transistor, so as to turn on the MOS transistor. Therefore, when the first driver module 10A drives the switch circuit 8 to an on state, the first driver module 10A may provide a voltage for the gate g1 of the first MOS transistor. When the voltage of the gate g1 of the first MOS transistor is higher than a breakover voltage of the first MOS transistor, the first MOS transistor can be turned on, so as to turn on the switch circuit 8.

It should be noted that a resistance of the first MOS transistor is relatively large; therefore, when the first MOS transistor is turned on, a relatively large amount of heat is generated inside the first MOS transistor, and is quite prone to burn the first MOS transistor. However, in this embodiment of the present invention, the relay 9 is further closed after the first MOS transistor is turned on. Because the relay 9 and the first MOS transistor are connected in parallel, some currents of the first external power supply may flow into the negative electrode of the first external power supply through the first MOS transistor, and other currents of the first external power supply may flow into the negative electrode of the first external power supply through the relay 9. In this way, fewer currents flow through the first MOS transistor, and less heat is generated inside the first MOS transistor when the first MOS transistor is turned on, so that the first MOS transistor is prevented from being burned.

Further, referring to FIG. 6, the switch circuit 8 further includes a second MOS transistor.

A gate g2 of the second MOS transistor is connected to the gate g1 of the first MOS transistor, a source s2 of the second MOS transistor and the second output end 10d of the single-source drive circuit 10 are connected to the source s1 of the first MOS transistor, and a drain d2 of the second MOS transistor is connected to the negative electrode of the first external power supply.

When a voltage of a gate of a MOS transistor is higher than a breakover voltage, a conductive channel is formed between a source and a drain of the MOS transistor, so as to turn on the MOS transistor. Therefore, when the first driver module 10A drives the switch circuit 8 to an on state, and the switch circuit 8 further includes the second MOS transistor, the first driver module 10A may further provide a voltage for the gate g2 of the second MOS transistor, so that the voltage of the gate g2 of the second MOS transistor is higher than a breakover voltage of the second MOS transistor. In this way, the second MOS transistor is turned on, so as to turn on the switch circuit 8.

A body diode is disposed on both the first MOS transistor and the second MOS transistor. Therefore, when the second MOS transistor is connected in series to the first MOS transistor in a forward manner, the body diode in the second MOS transistor is also connected in series to the body diode in the first MOS transistor in a forward manner. If reversed connection is performed on the first external power supply, the first MOS transistor and the second MOS transistor may be turned on by using only the body diodes of the first MOS transistor and the second MOS transistor and without using the single-source drive circuit 10. Consequently, the single-source drive circuit 10 fails to control the switch circuit 8. Therefore, in this embodiment of the present invention, the second MOS transistor is connected in series to the first MOS transistor in a reverse manner. In this case, the body diode in the second MOS transistor is also connected in series to the body diode in the first MOS transistor in a reverse manner. Therefore, the body diodes in the first MOS transistor and the second MOS transistor are in a reverse cut-off state during reversed connection of the first external power supply, and turning on and off of the switch circuit 8 are still controlled by the single-source drive circuit 10. This effectively avoids a failure in controlling the switch circuit 8 by the single-source drive circuit 10 during reversed connection of the first external power supply.

In addition, the switch circuit 8 and the load 7 are connected in series, and withstand voltage values of the first MOS transistor and the second MOS transistor that are included in the switch circuit 8 are relatively large. Therefore, when a circuit voltage rises due to reversed connection of the first external power supply, the first MOS transistor and the second MOS transistor may share a relatively large part of the voltage, so that the load 7 shares a relatively small part of the voltage. In this way, the load 7 is prevented from being damaged during reversed connection of the first external power supply.

Moreover, because the first MOS transistor and the second MOS transistor are connected in series in a reverse manner, a current in the switch circuit 8 may flow into the second MOS transistor through the first MOS transistor, and may also flow into the first MOS transistor through the second MOS transistor. Therefore, when forward connection is performed on both the load 7 and the first external power supply, the load 7 may be powered on/off by using the switch circuit 8, and when reversed connection is performed on both the load 7 and the first external power supply, the load 7 may also be powered on/off by using the switch circuit 8. That is, the power-on/off drive circuit in this embodiment of the present invention can implement bidirectional power-on/off driving.

It should be noted that structures of the switch circuit 8 that are shown in FIG. 5 and FIG. 6 may be replaced with each other, so as to form four power-on/off drive circuits.

Figure 7:
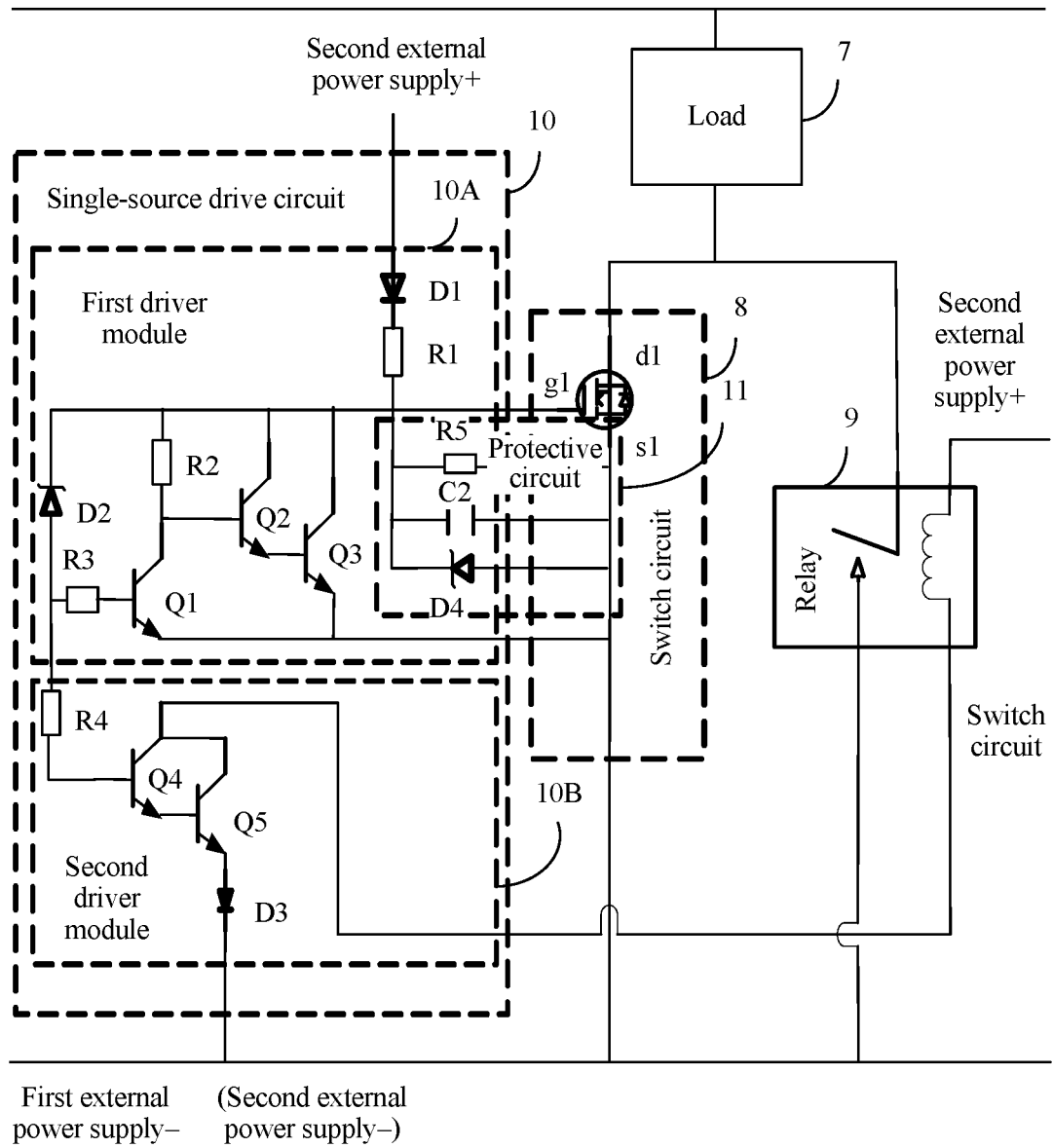
FIG. 7 is a schematic structural diagram of a fifth power-on/off drive circuit according to an embodiment of the present invention.

Referring to FIG. 7, the power-on/off drive circuit further includes a protective circuit 11, and the protective circuit 11 is connected in parallel between the gate g1 and the source s1 of the first MOS transistor.

Because input impedance of a gate of a MOS transistor is extremely high, electrostatic charge accumulation is quite likely to occur. In this way, a relatively high voltage is easily generated to break down an insulation layer between a gate and a source, so as to damage the MOS transistor. Therefore, in this embodiment of the present invention, the protective circuit 11 is connected in parallel between the gate g1 and the source s1 of the first MOS transistor. The protective circuit 11 may prevent a relatively high voltage from being generated between the gate g1 and the source s1 of the first MOS transistor, so as to prevent the relatively high voltage from damaging the first MOS transistor, and protect the switch circuit 8.

Figure 8:
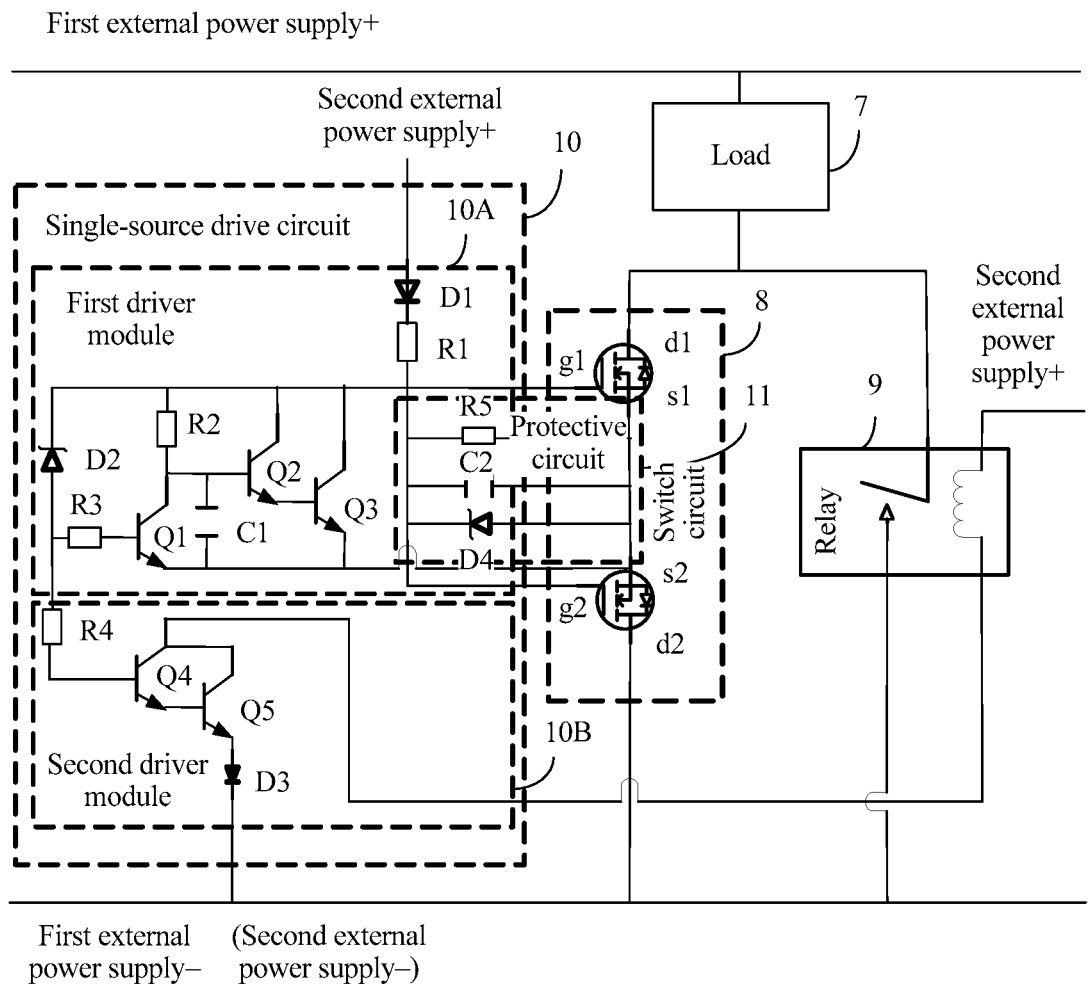
FIG. 8 is a schematic structural diagram of a sixth power-on/off drive circuit according to an embodiment of the present invention.

Further, referring to FIG. 8, when the switch circuit 8 not only includes both the first MOS transistor and the second MOS transistor, the gate g2 of the second MOS transistor is connected to the gate g1 of the first MOS transistor, and the source s2 of the second MOS transistor is connected to the source s1 of the first MOS transistor. Therefore, the protective circuit 11 is connected in parallel between the gate g1 and the source s1 of the first MOS transistor, that is, the protective circuit 11 is connected in parallel between the gate g2 and the source s2 of the second MOS transistor. The protective circuit 11 may not only protect the first MOS transistor, but also may prevent a relatively high voltage from being generated between the gate g2 and the source s2 of the second MOS transistor, so as to prevent the relatively high voltage from damaging the second MOS transistor.

Referring to FIG. 7, the protective circuit 11 includes a fifth resistor R5, a second capacitor C2, and a second voltage stabilization tube D4. The fifth resistor R5, the second capacitor C2, and the second voltage stabilization tube D4 are connected in parallel.

The fifth resistor R5 and the gate g1 and the source s1 of the first MOS transistor may form a current loop. Therefore, when charge accumulation occurs at the gate g1 of the first MOS transistor, a charge of the gate g1 may be released by using the fifth resistor R5 in the loop, to avoid charge accumulation, so as to prevent the first MOS transistor from being damaged by a relatively high voltage generated between the gate g1 and the source s1. In addition, the second capacitor C2 is connected in parallel to the fifth resistor R5, and may absorb the charge of the gate g1 to avoid charge accumulation, so as to further prevent the first MOS transistor from being damaged by a relatively high voltage generated between the gate g1 and the source s1. Moreover, when a relatively high voltage is generated between the gate g1 and the source s1 of the first MOS transistor, within a short time, the second voltage stabilization tube D4 may limit a voltage between the gate g1 and the source s1 of the first MOS transistor to a value below a stabilized voltage value of the second voltage stabilization tube D4, so as to reduce the voltage between the gate g1 and the source s1 of the first MOS transistor, and further prevent the first MOS transistor from being damaged.

It should be noted that the second voltage stabilization tube D4 may be a transient voltage suppressor (Transient Voltage Suppressor, TVS for short) diode. The TVS diode may absorb a transient high current caused by a transient high voltage, so as to quickly limit the transient high voltage to a value below a stabilized voltage value of the TVS. Certainly, the second voltage stabilization tube D4 may be another voltage stabilization tube that protects the first MOS transistor and the second MOS transistor. This is not specifically limited in this embodiment of the present invention.

Figure 9:
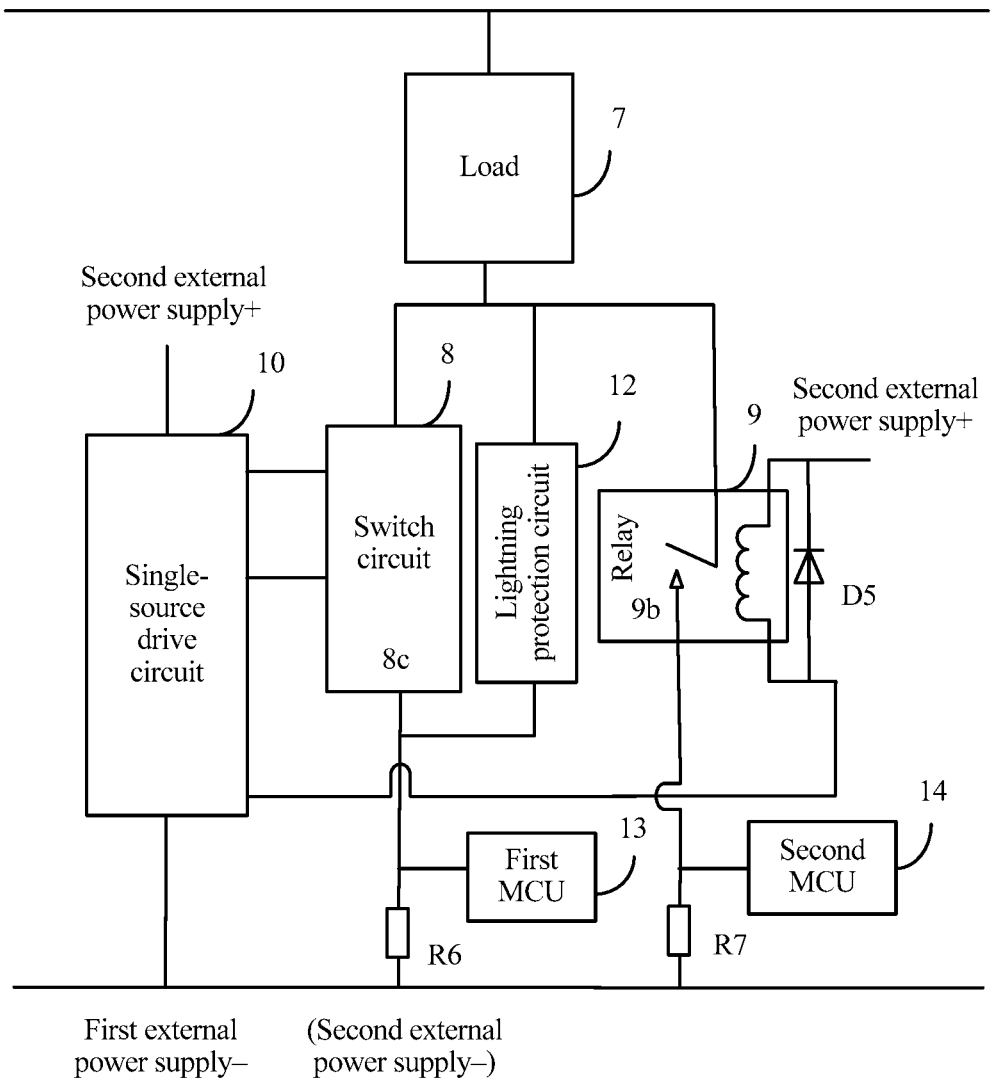
FIG. 9 is a schematic structural diagram of a seventh power-on/off drive circuit according to an embodiment of the present invention.

Referring to FIG. 9, the power-on/off drive circuit may further include a lightning protection circuit 12, and the lightning protection circuit 12 is connected in parallel to the switch circuit 8.

A relatively high voltage generated due to lightning or other abnormal situations damages a component in the power-on/off drive circuit. Therefore, pulse energy generated in the power-on/off drive circuit due to lightning induction or other abnormal situations may be released within a short time by using the lightning protection circuit 12. In this way, less relatively high voltages are generated due to lightning or other abnormal situations, so as to prevent the relatively high voltage from damaging the component in the power-on/off drive circuit, and protect the power-on/off drive circuit.

Referring to FIG. 9, the power-on/off drive circuit may further include a third diode D5. The third diode D5 is connected in parallel at the two ends of the coil in the relay 9, a cathode of the third diode D5 is connected to one end of the coil, and an anode of the third diode D5 is connected to the other end of the coil.

When the relay 9 is opened, there is a residual current in the coil in the relay 9, and if the residual current cannot be released in a timely manner, sparks are formed to damage the relay 9. Therefore, in this embodiment of the present invention, the third diode D5 is connected in parallel at the two ends of the coil in the relay 9. In this way, when the relay 9 is opened, the residual current in the coil may be released in a loop formed by the coil and the third diode D5, thereby protecting the relay 9.

Referring to FIG. 9, the power-on/off drive circuit may further include a sixth resistor R6 and a seventh resistor R7. One end of the sixth resistor R6 is connected to the output end 8c of the switch circuit 8, the other end of the sixth resistor R6 is connected to the negative electrode of the first external power supply, one end of the seventh resistor R7 is connected to the normally closed contact 9b of the relay 9, and the other end of the seventh resistor R7 is connected to the negative electrode of the first external power supply.

Referring to FIG. 9, the power-on/off drive circuit may further include a first MCU 13 and a second MCU 14. The output end 8c of the switch circuit 8 and one end of the sixth resistor R6 are separately connected to the first MCU 13, and the normally closed contact 9b of the relay 9 and one end of the seventh resistor R7 are separately connected to the second MCU 14.

It should be noted that the first MCU 13 is configured to collect a first current that flows through the switch circuit 8, and the second MCU 14 is configured to collect a second current that flows through the relay 9. The first current and the second current may be added to obtain an output current in the power-on/off drive circuit. Because power requirements of the load 7 at various moments may be different, the power-on/off drive circuit may adjust, based on the collected output current and a power requirement of the load 7 at a current moment, a current that is currently output by the first external power supply, so as to more properly power on/off the load 7, and improve flexibility and accuracy during power-on/off driving.

In this embodiment of the present invention, when a load is powered on, a second external power supply is switched on, a current of the second external power supply flows into a first driver module of a single-source drive circuit, and a first output end of the first driver module drives a switch circuit to an on state. After the switch circuit is turned on, the current of the second external power supply flows into a second driver module of the single-source drive circuit through a third output end of the first driver module, and the second driver module drives a relay to a closed state, so as to power on the load. Because the switch circuit and the relay are connected in parallel, the relay is closed when the switch circuit is in an on state, and in this case, the relay is closed with a zero voltage. Therefore, an electric arc is prevented from being generated at a moment when the relay is closed. When the load is powered off, the second external power supply is switched off, and the current that flows into the second driver module is disconnected to open the relay. After the relay is opened, the current that flows into the first driver module is disconnected to turn off the switch circuit, so as to power off the load. Because the switch circuit and the relay are connected in parallel, the relay is opened when the switch circuit is in an on state, and in this case, the relay is opened with a zero voltage. Therefore, an electric arc is prevented from being generated at a moment when the relay is opened. In addition, in the power-on/off drive circuit, the load can be powered on/off by using only the switch circuit and the relay and without using a contactor, and the switch circuit and the relay are controlled by a same single-source drive circuit. Therefore, an entire volume of the power-on/off drive circuit is reduced. Moreover, in the power-on/off drive circuit, the switch circuit and the relay can be controlled in sequence during power-on/off driving by using only pure hardware and without using an extra controller. In this way, a circuit structure is simplified, and circuit costs are reduced.

Figure 10:
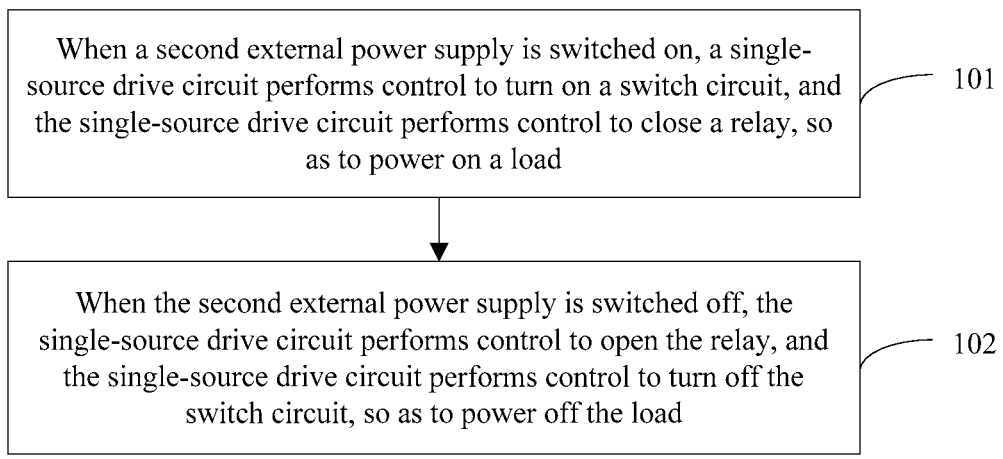
FIG. 10 is a flowchart of a method for controlling a power-on/off drive circuit according to an embodiment of the present invention.

FIG. 10 is a flowchart of a method for controlling a power-on/off drive circuit according to an embodiment of the present invention, and the power-on/off drive circuit in FIG. 2 and FIG. 3, and FIG. 5 to FIG. 9 may be controlled by using the method. Referring to FIG. 10, the method includes the following steps.

Step 101: When the second external power supply is switched on, the single-source drive circuit performs control to turn on the switch circuit, and the single-source drive circuit performs control to close the relay, so as to power on the load.

It should be noted that, in this embodiment of the present invention, a switch circuit and a relay are controlled by a same drive circuit. Therefore, the drive circuit may be referred to as a single-source drive circuit.

Specifically, the single-source drive circuit includes a first driver module and a second driver module, and there is a voltage stabilization feature at a third output end of the first driver module. When the second external power supply is switched on, a current of the second external power supply flows into the first driver module, and a first output end of the first driver module drives the switch circuit to an on state. Based on the voltage stabilization feature at the third output end of the first driver module, after the switch circuit is turned on, the current of the second external power supply flows into the second driver module through the third output end of the first driver module, and the second driver module drives the relay to a closed state, so as to power on the load.

The load may include devices such as a storage battery and a communications device. This is not specifically limited in this embodiment of the present invention. In addition, the second external power supply is configured to provide electric energy for the single-source drive circuit and the relay, and the electric energy provided by the second external power supply is used to turn on the switch circuit and close the relay.

As shown in FIG. 3, the power-on/off drive circuit outputs a voltage by using the first output end of the first driver module, to drive the switch circuit to an on state, and outputs a voltage to the second driver module by using the third output end of the first driver module, so that the second driver module drives the relay to a closed state. There is the voltage stabilization feature at the third output end of the first driver module, and the voltage stabilization feature can ensure that a time at which the third output end of the first driver module outputs a voltage is later than a time at which the first output end outputs a voltage. Therefore, a time at which turning on of the switch circuit is driven by using the voltage that is output from the first output end of the first driver module is earlier than a time at which closing of the relay is driven. That is, based on the voltage stabilization feature at the third output end of the first driver module, after the switch circuit is turned on, the current of the second external power supply flows into the second driver module through the third output end of the first driver module, and the second driver module drives the relay to a closed state.

As shown in FIG. 4, there is the voltage stabilization feature at the third output end of the first driver module. Therefore, at a moment t1 when the second external power supply is switched on, turning on of the switch circuit may be driven by using the voltage that is output from the first output end of the first driver module, and then the first driver module stabilizes a voltage of the first driver module within a time period T1 based on the voltage stabilization feature. The current of the second external power supply needs to flow into the second driver module through the third output end of the first driver module. Therefore, a current flows into the second driver module only at a moment t2 after the first driver module drives the switch circuit to an on state for a time period TI, and then the second driver module can drive the relay to a closed state.

It should be noted that, when the load is powered on, the single-source drive circuit first performs control to turn on the switch circuit, and then performs control to close the relay. Because the switch circuit and the relay are connected in parallel, the relay is closed when the switch circuit is in an on state, and in this case, the relay is closed with a zero voltage. Therefore, an electric arc is prevented from being generated at a moment when the relay is closed, arc extinguishing is implemented when the relay is closed, and the relay is prevented from being damaged.

Step 102: When the second external power supply is switched off, the single-source drive circuit performs control to open the relay, and the single-source drive circuit performs control to turn off the switch circuit, so as to power off the load.

Specifically, the single-source drive circuit includes a first driver module and a second driver module, and there is a voltage stabilization feature at a third output end of the first driver module. When the second external power supply is switched off, a current that flows into the second driver module is disconnected, so as to open the relay. Based on the voltage stabilization feature at the third output end of the first driver module, after the relay is opened, a current that flows into the first driver module is disconnected to turn off the switch circuit, so as to power off the load.

As shown in FIG. 3, the power-on/off drive circuit outputs a voltage by using the first output end of the first driver module, to drive the switch circuit, and outputs a voltage to the second driver module by using the third output end of the first driver module, so that the second driver module drives the relay. The voltage stabilization feature at the third output end of the first driver module can ensure that a time at which the voltage is disconnected at the third output end of the first driver module is earlier than a time at which the voltage is disconnected at the first output end. Therefore, a time at which the relay is opened is earlier than a time at which the switch circuit is turned off. That is, based on the voltage stabilization feature at the third output end of the first driver module, after the relay is opened, the current that flows into the first driver module may be disconnected, so as to turn off the switch circuit.

As shown in FIG. 4, at a moment t3 when the second external power supply is switched off, no current flows into the second driver module, and the relay is opened. There is the voltage stabilization feature at the third output end of the first driver module. Therefore, when the second external power supply is switched off, the first driver module may maintain the voltage of the first driver module within a time period T2 based on the voltage stabilization feature, so as to keep the switch circuit in an on state. At a moment t4 after the time period T2, no current exists in the first driver module, and the switch circuit is turned off.

It should be noted that, when the load is powered off, the single-source drive circuit first performs control to open the relay, and then performs control to turn off the switch circuit. Because the switch circuit and the relay are connected in parallel, the relay is opened when the switch circuit is in an on state, and in this case, the relay is opened with a zero voltage. Therefore, an electric arc is prevented from being generated at a moment when the relay is opened, arc extinguishing is implemented when the relay is opened, and the relay is prevented from being damaged.

When the second external power supply is switched on or switched off, a user may manually connect or disconnect the second external power supply, or certainly, the second external power supply may be intelligently connected or disconnected by using a control policy. This is not specifically limited in this embodiment of the present invention.

It should be noted that, in the power-on/off drive circuit, the load can be powered on/off by using only the switch circuit and the relay and without using a contactor. The switch circuit and the relay are controlled by a same single-source drive circuit, and do not need to be manually controlled. Therefore, an entire volume of the power-on/off drive circuit is reduced, and the power-on/off drive circuit is made more intelligent.

In addition, in this embodiment of the present invention, when the load is powered on, the switch circuit is first turned on, and then the relay is closed. When the load is powered off, the relay is first opened, and then the switch circuit is turned off. In addition, the switch circuit and the relay can be controlled in sequence during power-on/off driving by using only pure hardware and without using an extra controller. In this way, a circuit structure is simplified, and circuit costs are reduced.

In this embodiment of the present invention, when a load is powered on, a second external power supply is switched on. A current of the second external power supply flows into a first driver module of a single-source drive circuit, and a first output end of the first driver module drives a switch circuit to an on state. After the switch circuit is turned on, the current of the second external power supply flows into a second driver module of the single-source drive circuit through a third output end of the first driver module, and the second driver module drives a relay to a closed state, so as to power on the load. Because the switch circuit and the relay are connected in parallel, the relay is closed when the switch circuit is in an on state, and in this case, the relay is closed with a zero voltage. Therefore, an electric arc is prevented from being generated at a moment when the relay is closed. When the load is powered off, the second external power supply is switched off, and the current that flows into the second driver module is disconnected to open the relay. Based on a voltage stabilization feature at the third output end of the first driver module, after the relay is opened, the current that flows into the first driver module is disconnected to turn off the switch circuit, so as to power off the load. Because the switch circuit and the relay are connected in parallel, the relay is opened when the switch circuit is in an on state, and in this case, the relay is opened with a zero voltage. Therefore, an electric arc is prevented from being generated at a moment when the relay is opened. In addition, in the power-on/off drive circuit, the load can be powered on/off by using only the switch circuit and the relay and without using a contactor, and the switch circuit and the relay are controlled by a same single-source drive circuit. Therefore, an entire volume of the power-on/off drive circuit is reduced. Moreover, in the power-on/off drive circuit, the switch circuit and the relay can be controlled in sequence during power-on/off driving by using only pure hardware and without using an extra controller. In this way, a circuit structure is simplified, and circuit costs are reduced.

A person of ordinary skill in the art may understand that all or some of the steps of the embodiments may be implemented by hardware or a program instructing related hardware. The program may be stored in a computer-readable storage medium. The storage medium may include: a read-only memory, a magnetic disk, or an optical disc.

The foregoing descriptions are merely examples of embodiments of the present invention, but are not intended to limit the present invention. Any modification, equivalent replacement, and improvement made without departing from the spirit and principle of the present invention shall fall within the protection scope of the present invention.

What is claimed is:

1. A power-on/off drive circuit, wherein the power-on/off drive circuit comprises a load, a switch circuit, a relay, and a single-source drive circuit, and the single-source drive circuit is a drive circuit that controls the switch circuit and the relay; and, wherein
   one end of the load is connected to a positive electrode of a first external power supply, a first input end of the switch circuit and a normally open contact of the relay are separately connected to the other end of the load, and an output end of the switch circuit and a normally closed contact of the relay are separately connected to a negative electrode of the first external power supply;
   one end of a coil in the relay is connected to a positive electrode of a second external power supply, a first input end of the single-source drive circuit is connected to the positive electrode of the second external power supply, and the other end of the coil in the relay is connected to a second input end of the single-source drive circuit;
   a first output end of the single-source drive circuit is connected to a second input end of the switch circuit, a second output end of the single-source drive circuit is connected to the output end of the switch circuit, and a third output end of the single-source drive circuit is connected to a negative electrode of the second external power supply; and
   the first external power supply and the second external power supply have a same negative electrode; when the second external power supply is switched on, the single-source drive circuit is configured to perform control to turn on the switch circuit and perform control to close the relay, so as to power on the load; when the second external power supply is switched off, the single-source drive circuit is configured to perform control to open the relay and perform control to turn off the switch circuit, so as to power off the load; and the second external power supply is configured to provide electric energy for the single-source drive circuit and the relay;
   wherein the single-source drive circuit comprises a first driver module and a second driver module, wherein
   an input end of the first driver module is connected to the positive electrode of the second external power supply, a first output end of the first driver module is connected to the second input end of the switch circuit, and a second output end of the first driver module is connected to the output end of the switch circuit;
   a third output end of the first driver module is connected to a first input end of the second driver module, a second input end of the second driver module is connected to the other end of the coil in the relay, and an output end of the second driver module is connected to the negative electrode of the second external power supply; and
   there is a voltage stabilization feature at the third output end of the first driver module; and wherein
   the first driver module comprises a first diode, a first resistor, a second resistor, a third resistor, a first voltage stabilization tube, a first transistor, a second transistor, and a third transistor;
   an anode of the first diode is connected to the positive electrode of the second external power supply, a cathode of the first diode is connected to one end of the first resistor, and a positive electrode of the first voltage stabilization tube, one end of the second resistor, a collector of the second transistor, a collector of the third transistor, and the second input end of the switch circuit are separately connected to the other end of the first resistor;
   a negative electrode of the first voltage stabilization tube is connected to one end of the third resistor, the other end of the third resistor is connected to a base of the first transistor, a collector of the first transistor and the other end of the second resistor are separately connected to a base of the second transistor, and an emitter of the second transistor is connected to a base of the third transistor; and
   an emitter of the first transistor and an emitter of the third transistor are separately connected to the output end of the switch circuit.

2. The power-on/off drive circuit according to claim 1, wherein the first driver module further comprises a first capacitor; and
   the first capacitor is connected in parallel between the collector and the emitter of the first transistor.

3. The power-on/off drive circuit according to 2, wherein the second driver module comprises a fourth resistor, a fourth transistor, a fifth transistor, and a second diode;
   one end of the fourth resistor is connected to the negative electrode of the first voltage stabilization tube, the other end of the fourth resistor is connected to a base of the fourth transistor, an emitter of the fourth transistor is connected to a base of the fifth transistor, an emitter of the fifth transistor is connected to an anode of the second diode, and a cathode of the second diode is connected to the negative electrode of the second external power supply; and
   a collector of the fourth transistor and a collector of the fifth transistor are separately connected to the other end of the coil in the relay.

4. The power-on/off drive circuit according to claim 3, wherein the switch circuit comprises a first metal oxide semiconductor(MOS) transistor; and
   a drain of the first MOS transistor is connected to the other end of the load, a gate of the first MOS transistor is connected to the first output end of the single-source drive circuit, and the second output end of the single-source drive circuit and the negative electrode of the first external power supply are separately connected to a source of the first MOS transistor.

5. The power-on/off drive circuit according to claim 4, wherein the switch circuit further comprises a second MOS transistor; and
a gate of the second MOS transistor is connected to the gate of the first MOS transistor, a source of the second MOS transistor and the second output end of the single-source drive circuit are separately connected to the source of the first MOS transistor, and a drain of the second MOS transistor is connected to the negative electrode of the first external power supply.

6. The power-on/off drive circuit according to claim 5, wherein the power-on/off drive circuit further comprises a protective circuit; and
the protective circuit is connected in parallel between the gate and the source of the first MOS transistor.

7. The power-on/off drive circuit according to claim 6, wherein the protective circuit comprises a fifth resistor, a second capacitor, and a second voltage stabilization tube; and
the fifth resistor, the second capacitor, and the second voltage stabilization tube are connected in parallel.

8. A method for controlling the power-on/off drive circuit according to claim 1, wherein the method comprises:
performing, by the single-source drive circuit when the second external power supply is switched on, control to turn on the switch circuit and close the relay, so as to power on the load; or
performing, by the single-source drive circuit when the second external power supply is switched off, control to open the relay and turn off the switch circuit, so as to power off the load.

9. The method according to claim 8, wherein the single-source drive circuit comprises a first driver module and a second driver module, and there is a voltage stabilization feature at a third output end of the first driver module; and
the performing, by the single-source drive circuit when the second external power supply is switched on, control to turn on the switch circuit and close the relay comprises:
when the second external power supply is switched on, enabling a current of the second external power supply to flow into the first driver module, and driving, by a first output end of the first driver module, the switch circuit to an on state; and
based on the voltage stabilization feature at the third output end of the first driver module, after the switch circuit is turned on, enabling the current of the second external power supply to flow into the second driver module through the third output end of the first driver module, and driving, by the second driver module, the relay to a closed state.

10. The method according to claim 8, wherein the single-source drive circuit comprises a first driver module and a second driver module, and there is a voltage stabilization feature at a third output end of the first driver module; and
the performing, by the single-source drive circuit when the second external power supply is switched off, control to open the relay and turn off the switch circuit comprises:
when the second external power supply is switched off, disconnecting a current that flows into the second driver module, to open the relay; and
based on the voltage stabilization feature at the third output end of the first driver module, after the relay is opened, disconnecting a current that flows into the first driver module, to turn off the switch circuit.

* * * * *